United States Patent [19]

Harding et al.

[11] Patent Number: 4,661,954
[45] Date of Patent: Apr. 28, 1987

[54] ERROR PROTECTION OF LINEARLY CODED DIGITAL SIGNALS

[75] Inventors: Wilfrid B. Harding; Mohammad B. Amin, both of Hampshire, United Kingdom

[73] Assignee: Independent Broadcasting Authority, London, United Kingdom

[21] Appl. No.: 678,689

[22] PCT Filed: Apr. 11, 1984

[86] PCT No.: PCT/GB84/00125

§ 371 Date: Dec. 4, 1984

§ 102(e) Date: Dec. 4, 1984

[87] PCT Pub. No.: WO84/04218

PCT Pub. Date: Oct. 25, 1984

[30] Foreign Application Priority Data

Apr. 11, 1983 [GB] United Kingdom ............... 8309768

[51] Int. Cl.[4] ............................................ G06F 11/00
[52] U.S. Cl. ..................................... 371/37; 371/2
[58] Field of Search ................................. 371/2, 37

[56] References Cited

U.S. PATENT DOCUMENTS

| | | | |
|---|---|---|---|
| 4,199,809 | 4/1980 | Pasahow | 371/37 X |
| 4,208,650 | 6/1980 | Horn | 371/47 |
| 4,426,698 | 1/1984 | Pargee | 371/37 |
| 4,447,902 | 5/1984 | Wilkinson | 371/37 X |
| 4,491,869 | 1/1985 | Heitmann | 340/347 X |
| 4,539,683 | 9/1985 | Hahn | 371/25 X |
| 4,551,842 | 11/1985 | Segarra | 371/30 X |
| 4,555,729 | 11/1985 | Driessen | 371/37 X |
| 4,567,591 | 1/1986 | Gray | 371/43 X |

OTHER PUBLICATIONS

D. W. Davies, "Communications Networks for Computers", 1973, pp. 30-31.
R. Steele, "Bell System Technical Journal", vol. 56, No. 3, Mar. 1977, pp. 399-409.
IEEE, "1974 International Zurich Seminar on Digital Communications", pp. B1(3)-B1(4), Mar. 1974.

Primary Examiner—Jerry Smith
Assistant Examiner—Robert W. Beausoliel, Jr.
Attorney, Agent, or Firm—Watson Cole Grindle & Watson

[57] ABSTRACT

A method and apparatus for error-correcting a digital signal by reception of an error-protected digital signal including error correction information and further information representing a parameter of the signal in each of a plurality of blocks of digital information present in the signal, deriving the further information from the signal, decoding error protection information from the signal, deriving protected signal information and separating it into blocks, correcting errors in each block of protected digital information in response to information derived from the further information and the error protection information including pre-correcting the protected digital information using the further information and error-correcting the thus pre-corrected signal using the error protection information.

8 Claims, 3 Drawing Figures

| RANGE CODE | BIT POSITIONS PROTECTED | | | | | |
|---|---|---|---|---|---|---|
| 7 | 13 | 12 | 11 | 10 | 9 | 8 |
| 6 | 13 | 11 | 10 | 9 | 8 | 7 |
| 5 | 13 | 10 | 9 | 8 | 7 | 6 |
| 4 | 13 | 9 | 8 | 7 | 6 | 5 |
| 3 | 13 | 8 | 7 | 6 | 5 | 4 |
| 2 | 13 | 7 | 6 | 5 | 4 | 3 |
| 1 | 13 | 6 | 5 | 4 | 3 | 2 |
| 0 | 13 | 5 | 4 | 3 | 2 | 1 |

*Fig. 1.*

| BIT POSITION → | 13 | 12 | 11 | 10 | 9 | 8 | 7 | 6 | 5 | 4 | 3 | 2 | 1 | 0 | RANGE CODE |
|---|---|---|---|---|---|---|---|---|---|---|---|---|---|---|---|
| | S | 1 | 1 | 1 | 1 | 1 | 1 | 1 | 1 | 1 | 1 | 1 | 1 | 1 | 7 |
| | S | 1 | 0 | 0 | 0 | 0 | 0 | 0 | 0 | 0 | 0 | 0 | 0 | 0 | |
| | S | 0 | 1 | 1 | 1 | 1 | 1 | 1 | 1 | 1 | 1 | 1 | 1 | 1 | 6 |
| | S | 0 | 1 | 0 | 0 | 0 | 0 | 0 | 0 | 0 | 0 | 0 | 0 | 0 | |
| | S | 0 | 0 | 1 | 1 | 1 | 1 | 1 | 1 | 1 | 1 | 1 | 1 | 1 | 5 |
| | S | 0 | 0 | 1 | 0 | 0 | 0 | 0 | 0 | 0 | 0 | 0 | 0 | 0 | |
| | S | 0 | 0 | 0 | 1 | 1 | 1 | 1 | 1 | 1 | 1 | 1 | 1 | 1 | 4 |
| | S | 0 | 0 | 0 | 1 | 0 | 0 | 0 | 0 | 0 | 0 | 0 | 0 | 0 | |
| | S | 0 | 0 | 0 | 0 | 1 | 1 | 1 | 1 | 1 | 1 | 1 | 1 | 1 | 3 |
| | S | 0 | 0 | 0 | 0 | 1 | 0 | 0 | 0 | 0 | 0 | 0 | 0 | 0 | |
| | S | 0 | 0 | 0 | 0 | 0 | 1 | 1 | 1 | 1 | 1 | 1 | 1 | 1 | 2 |
| | S | 0 | 0 | 0 | 0 | 0 | 1 | 0 | 0 | 0 | 0 | 0 | 0 | 0 | |
| | S | 0 | 0 | 0 | 0 | 0 | 0 | 1 | 1 | 1 | 1 | 1 | 1 | 1 | 1 |
| | S | 0 | 0 | 0 | 0 | 0 | 0 | 1 | 0 | 0 | 0 | 0 | 0 | 0 | |
| | S | 0 | 0 | 0 | 0 | 0 | 0 | 0 | 1 | 1 | 1 | 1 | 1 | 1 | 0 |
| | S | 0 | 0 | 0 | 0 | 0 | 0 | 0 | 1 | 0 | 0 | 0 | 0 | 0 | |

[S] REPRESENTS SIGN BIT

FIG. 2.

ERROR PROTECTION OF LINEARLY CODED DIGITAL SIGNALS

BACKGROUND OF THE INVENTION

Field of the Invention

The present invention relates to a method and apparatus of providing improved protection of the more significant bits of a linearly coded and error-protected digital signal (e.g. audio, vision, etc.) making recursive use of the coded range information.

SUMMARY OF THE INVENTION

An object of the present invention is to improve the decoding performance of a digital receiver under noisy channel conditions with little or no increase in the transmission bit rate.

The present invention provides a method of error correcting a digital signal comprising receiving an error protected digital signal which includes error correction information and further information representing a parameter of the signal in each of a plurality of blocks of digital information present in the signal, deriving the further information, decoding error protection information from the signal, deriving the protected digital information and separating it into blocks, and subjecting each block of protected digital information to error correction in response to information derived from the further information and the error protection information.

BRIEF DESCRIPTION OF THE DRAWINGS

Features and advantages of the present invention will become apparent from the following description of an embodiment thereof when taken in conjunction with the accompanying drawings, in which:

FIG. 1 shows a table of range codes and corresponding bit positions to which each error protection code refers for one embodiment of the present invention;

FIG. 2 shows a table representing a range coding scheme for 14-bit samples; and

DETAILED DESCRIPTION

Figure 3:
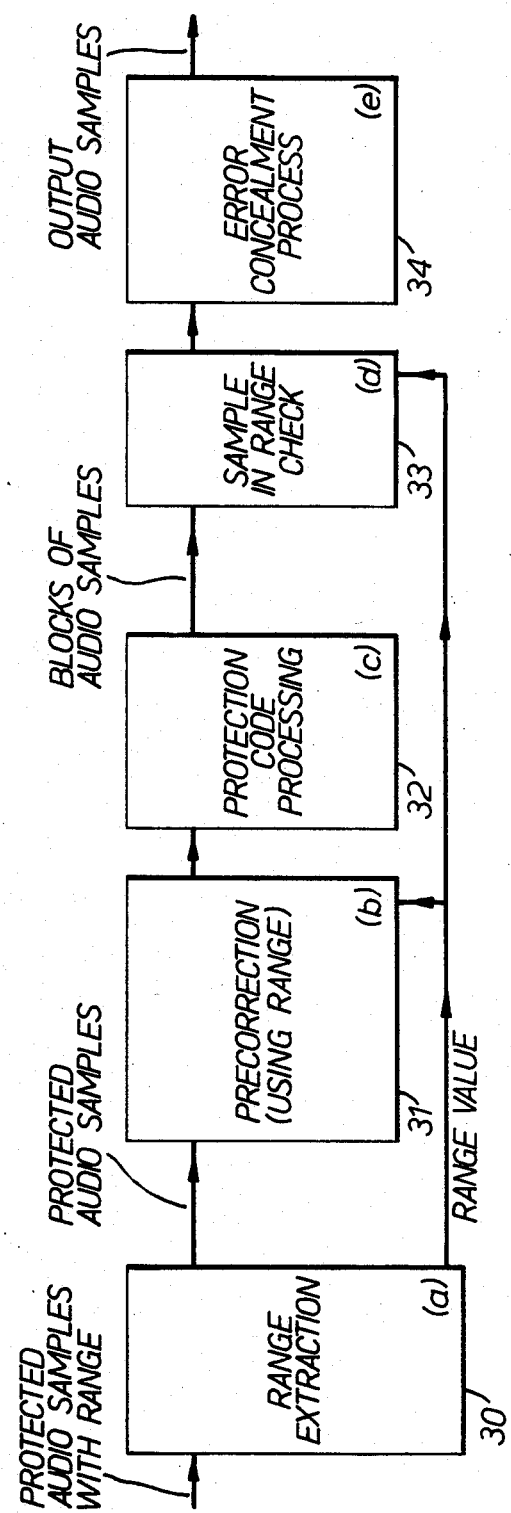
FIG. 3 shows a block diagram of a part of a receiver according to the present invention.

A fixed number of digitally encoded sequentially placed samples forms a 'Range Code Block'. Each of these blocks is assigned a 'Range Code' which signals the amplitude of the largest sample within that block. The 'Range Code' information can in most cases be buried within the original error protection coding of the digital samples without further increasing the transmission bit-rate. However, if 'Range Code' is sent separately, there will be a slight increase in the transmission bit-rate.

At the receiving end, the recovery of the 'Range Code' ascertains the maximum possible value of the largest digital sample within that 'block'. Any transmission errors affecting bits at more significant positions in the sample than indicated by the 'Range Code' value is first corrected. Digital samples are then decoded for error-correction using the coding scheme used for the samples. An error extension due to the decoding procedure introducing new errors in the more significant positions in the sample is again suppressed using 'Range Code' information.

Any error detected by the use of the range code information for the second time can, for example, be dealt with by the substitution of the affected sample with a new one formed from the contributions of the nearby samples according to some pre-fixed algorithms. As an example, in the case of samples protected by single error-correcting Hamming code, the use of the range code after Hamming decoding will detect some of the multiple errors occuring within the active part of the sample concerned, thus making significant improvement to the decoder performance.

The significance of this technique is that a part of a digital sample (having higher information content) is already decoded before even the application of the actual error-protection decoding used for the sample. The result is that any subsequent error-correction decoding process for the sample will have to deal with a fewer number of information bits than was originally used in the encoding, thus resulting in an improvement of the decoding capacity.

An extension of this technique can be used to provide an error protection on a fixed number of bits per sample but the position of which can be varied according to the 'Range Code'. Thus, during a period of weaker signal more of the least significant bits are protected than for a period of a stronger signal. The technique is illustrated in FIG. 1 for the case of digital audio. In this illustration, the Range Coding Scheme shown in FIG. 2 has been assumed and a (n, 6) code has been used to protect each audio sample for error correction. FIG. 1 shows the positions of the bits that have been protected by the coding for different Range Codes.

EXAMPLES OF APPLICATION IN DIGITAL AUDIO

Statistically a band-limited pre-emphasised audio signal contains amplitudes much lower than the maximum value for a large proportion of time. In the case of digital audio for satellite broadcasting, the analogue signal is sampled at 32 KHz and digitised for 14 bits per sample accuracy. 32 sequentially placed samples (1 m.sec) form a 'Range Code Block' and a typical range coding scheme is shown in FIG. 2. The digital audio samples are then coded for error protection (e.g. Hamming Code, BCH Code, etc.). The 'Range Code' used for the block can be buried within the error protection bits using well known techniques.

On reception, the 'Range Code' information is extracted using the coding law of the audio samples and is used for fixing the value of appropriate number of most significant bits (msb) in the audio sample according to the procedure described above. The remaining bits in the audio samples are then decoded using the coding scheme originally used for the sample. Any decoding-error extending bit-errors in any position under the control of the 'Range Code' is again corrected from the knowledge of the 'Range Code' information.

Example:
suppose the maximum amplitude of any audio sample in a 'Range Code' block lies in the range [S] 000 111 111 1111 to [S] 000 100 000 0000 resulting in a Range Code of 100- and 10 most significant bits of each of the samples are protected for single error correction using (14, 10) Hamming Code-([S] represents the sign bit).

Upon recovery of the Range Code (100), the decoder immediately places 3 zeros at bit positions 10, 11 and 12 and the Hamming code now requires only to decode [S] bit and six other information bits at positions 4 through 9. However, if a wrong Hamming decoding indicates a 1 in any of the positions 10-12, they are discarded because of the available range code information.

The scheme although described using examples of only sign-magnitude binary coding is equally applicable to other types of digital representation of samples (e.g. 2's complement coding, etc.).

The above error protected signal may be combined with a multiplexed analogue video signal.

FIG. 3 shows, in a block diagram form, one way in which receiving apparatus can be constructed in order to perform the operation described above. Before describing FIG. 3 in detail it is thought advisable to relate the technique to a practical situation and the following description is on the basis that the digital information forms part of the C-MAC television signal.

A receiver for such a signal includes clock regeneration circuits and synchronisation circuits. These circuits are used to provide the basic timing information which is used to clock each block of information received by the receiving apparatus through the error correction and processing circuitry to be described. It is not thought necessary to describe in detail the synchronisation and clock regeneration techniques.

Turning now to FIG. 3 the received protected digital signal with error protection information and range code information is received and clocked into circuitry 30 which extracts or decodes the range code for each block of digital samples. If the range code is sent separately from the error correction information this is a relatively straight forward process but if the range code information is contained as a sub-code within the error correction information it is necessary first of all to at least partly decode the error correction information in order to extract the range code information. This of course entails delaying the protected digital information while such decoding takes place.

Thereafter pre-correction of the protected digital information is undertaken in a pre-correction circuit 31 in accordance with the range code value extracted from the range code information. This may be done using majority logic or known logic zeroes into the digital samples using the range code information.

The thus, pre-corrected digital information is then fed to a protection code processing circuit 32 where either all or the remaining un-decoded error correction information is finally decoded. It will be recalled that this error correction information is in the form of, for example, Hamming or DCH protection code. Additional information thus stripped of its error protection information is passed to a circuit 33 which checks the digital information and any samples that do not conform to the correct range as indicated by the range value derived from the range code are either part corrected or flagged as erroneous. The digital information including the flagged information is then fed to an error concealment circuit 34 where any samples which have been flagged potentially erroneous are concealed, for example, by interpolation from adjacent samples. The output digital samples are then fed for further processing for example in audio circuits of the television receiver.

What is claimed is:

1. A method of error-correcting a digital signal, comprising receiving an error-protected digital signal which includes error correction information and further information representing a parameter of the signal in each of a plurality of blocks of digital information present in the signal, deriving the further information from the signal, decoding error protection information from the signal, deriving protected digital information and separating it into blocks, pre-correcting the protected digital information using the further information and error-correcting the thus pre-corrected signal using the error protection information, and correcting errors in each block of protected digital information in response to information derived from the further information and the error protection information.

2. A method according to claim 1, wherein the further information is received separately from the error protection information.

3. A method according to claim 1, wherein the further information is contained within the error protection information and is derived from the received and at least partially decoded error protection information.

4. A method according to claim 1, wherein the further information is indicative of the largest amplitude signal in each block.

5. Receiving apparatus for receiving an error-protected digital signal which includes error correction information and further information representing a parameter of the signal in each of a plurality of blocks of digital information present in the signal, comprising means for separating protected digital information from error correction and further information, and means for correcting the protected digital information in response to information derived from the further information and the error protection information, and said correcting means comprises pre-correction means responsive to said further information for pre-correcting the protected digital information, and second correction means responsive to the error correction information for correcting the corrected protected digital information from the pre-correction means.

6. Receiving apparatus according to claim 5, and comprising error concealment means arranged to receive the corrected protected digital information from the correction means and for producing error-corrected and concealed digital information.

7. Receiving apparatus according to claim 5, and comprising means for receiving the further information separately from the error correction information.

8. Receiving apparatus according to claim 5, and comprising means for deriving the further information from error correction information.

* * * * *